(12) United States Patent
Takahashi et al.

(10) Patent No.: US 7,871,756 B2
(45) Date of Patent: Jan. 18, 2011

(54) CHEMICALLY AMPLIFIED POSITIVE PHOTOSENSITIVE THERMOSETTING RESIN COMPOSITION, METHOD OF FORMING CURED ARTICLE, AND METHOD OF PRODUCING FUNCTIONAL DEVICE

(75) Inventors: Toru Takahashi, Kawasaki (JP); Naoya Katsumata, Kawasaki (JP); Hiroki Maeda, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 430 days.

(21) Appl. No.: 10/580,065

(22) PCT Filed: Nov. 18, 2004

(86) PCT No.: PCT/JP2004/017533
§ 371 (c)(1),
(2), (4) Date: May 29, 2007

(87) PCT Pub. No.: WO2005/052688
PCT Pub. Date: Jun. 9, 2005

(65) Prior Publication Data
US 2008/0044764 A1   Feb. 21, 2008

(30) Foreign Application Priority Data
Nov. 25, 2003 (JP) .......................... P2003-393812
Sep. 8, 2004 (JP) .......................... P2004-260765

(51) Int. Cl.
*G03F 7/022* (2006.01)
*G03F 7/004* (2006.01)
*G03F 7/039* (2006.01)

(52) U.S. Cl. .................. 430/280.1; 430/325; 430/330

(58) Field of Classification Search .................. None
See application file for complete search history.

(56) References Cited

U.S. PATENT DOCUMENTS

| 3,954,475 A * | 5/1976 | Bonham et al. .......... 430/281.1 |
| 4,248,957 A * | 2/1981 | Sander et al. ............ 430/270.1 |
| 4,943,516 A | 7/1990 | Kamayachi et al. |
| 4,994,346 A * | 2/1991 | Meier et al. .............. 430/280.1 |
| 5,262,280 A * | 11/1993 | Knudsen et al. .............. 430/312 |
| 5,527,656 A | 6/1996 | Imai et al. |
| 5,605,941 A | 2/1997 | Steinmann et al. |
| 5,876,900 A | 3/1999 | Watanabe et al. |
| 5,948,589 A | 9/1999 | Sato et al. |
| 6,004,724 A | 12/1999 | Yamato et al. |
| 6,309,796 B1 * | 10/2001 | Nakashima et al. ....... 430/287.1 |
| 2002/0102501 A1 | 8/2002 | Ichikawa et al. |
| 2004/0009363 A1 * | 1/2004 | Shouldice et al. ............ 428/523 |

FOREIGN PATENT DOCUMENTS

| EP | 0 544 294 A2 | 6/1993 |
| EP | 0 609 684 A1 | 8/1994 |
| EP | 0646580 A2 | 4/1995 |
| EP | 0 702 271 A1 | 9/1995 |
| JP | 58-194834 | 11/1983 |
| JP | H06-148889 | 5/1994 |
| JP | H06-289614 | 10/1994 |
| JP | H6-313134 | 11/1994 |
| JP | H07-134412 | 5/1995 |
| JP | H11-286535 | 10/1999 |
| JP | 2001-27806 | 1/2001 |

OTHER PUBLICATIONS

Yamaoka et al, "Dual-mode Behavior of Vinyl Ether Functionalized Photoresist", Journal of Photopolymer Science and Technology, vol. um 7, No. 3, 1994 pp. 533-536 , no month given.*
Ciba "photoinitiator" from http://www.ciba.com/photoinitiator printed Mar. 3, 2010, 2 pages +.*
Cationic photoinitiators Sigma-Aldrich, from www.sigmaaldrich. com, 8 pages printed out Mar. 3, 2010.*
Notice of Decision to Grant a Patent issued on May 20, 2008, on the counterpart Japanese Application No. 2004-260765.
Office Action issued in counterpart European Patent Application No. 04799821.6, dated Aug. 10, 2010.

* cited by examiner

*Primary Examiner*—Cynthia Hamilton
(74) *Attorney, Agent, or Firm*—Knobbe, Martens, Olson & Bear, LLP

(57) ABSTRACT

There is provided a photosensitive thermosetting resin composition used for producing a permanent film, capable of forming a resin layer which is excellent in fluidity upon heat bonding after pattern, formation and also has excellent adhesion as well as bonding properties and/or sealing properties. This composition contains a reaction product of (A) an alkali soluble resin and (C) a 10 crosslinking polyvinyl ether compound, (B) a compound generating an acid under irradiation with radiation, and (D) an epoxy resin.

11 Claims, 2 Drawing Sheets

CHEMICALLY AMPLIFIED POSITIVE PHOTOSENSITIVE THERMOSETTING RESIN COMPOSITION, METHOD OF FORMING CURED ARTICLE, AND METHOD OF PRODUCING FUNCTIONAL DEVICE

CROSS-REFERENCE TO RELATED APPLICATIONS

This application is the U.S. National Phase filing under 35 U.S.C. §371 of PCT/JP2004/017533, filed Nov. 18, 2004, which designated the United States and was published in a language other than English, which claims priority under 35 U.S.C. §119(a)-(d) to Japanese Patent Application Nos. 2003-393812, filed Nov. 25, 2003 and 2004-260765, filed Sep. 8, 2004. The content of these applications is incorporated herein by reference in their entireties.

TECHNICAL FIELD

The present invention relates to a chemically amplified positive photosensitive thermosetting resin composition, to a method of forming a cured article, and to a method of producing a functional device.

BACKGROUND ART

Photosensitive resin compositions can have various solubilities in a developer solution when irradiated by light, and photosensitive resin compositions in which solubility in the developer solution is decreased when irradiated by light are referred to as "negative", whereas, photosensitive resin compositions in which solubility in the developer solution is increased when irradiated by light is referred to as "positive". Specifically, there are known photosensitive resin composition prepared by dissolving an alkali soluble resin and a quinonediazido group-containing compound as a photoactive compound in an organic solvent, and a so-called chemically amplified photosensitive resin composition prepared by dissolving a base resin having variable alkali solubility due to an action of an acid, and a photoacid generator which generates an acid when exposed in an organic solvent.

Heretofore, photosensitive resin compositions have been used for various purposes, for example, for a so-called permanent film. "Permanent film" is a generic term for a coating film made of a photosensitive resin composition formed on or between parts constituting a product which remains even after the completion of the product.

Specific examples thereof include protective solder resists to be formed on the surface of a circuit board; packaging materials for protection of an element; underfilling materials (sealers) which are formed as a cured resin article in the space between an integrated circuit element and a circuit board, reliability of connection being improved by dispersing stress concentrated in the connection portion into the cured resin article; and those used as a bonding layer for bonding a bonding layer or an integrated circuit element of package parts such as a circuit element with a circuit board (see Patent Documents 1 and 2).

Patent Documents 1 and 2 describe methods for production of electronic parts, which comprises bonding a first substrate on which plural electrodes are formed at intervals with a second substrate on which plural electrodes are similarly formed at intervals at positions corresponding to the above electrodes using a permanent film made of a negative photosensitive resin composition.

Specifically, on the first substrate, a negative photosensitive resin composition is applied so as to coat electrodes, and the portion provided with no electrodes is selectively irradiated with light via a mask, and is then developed.

Consequently, a coating layer on the electrodes is removed to form a bonding layer made of the cured negative photosensitive resin composition between the electrodes formed on the first substrate. The size of the bonding layer in the height direction (size in the thickness direction of substrate) is slightly greater than that of the electrodes formed on the first substrate.

After the surface on which the electrodes and the bonding layer are formed of the first substrate, and the surface on which the electrodes and the bonding layer are formed of the second substrate, are allowed to face each other, they are made to contact.

When subjected to a heat treatment, the bonding layer formed between adjacent electrodes of the first substrate is softened and bonded to the inner wall (side wall of the electrodes and top face of the substrate) in the space between adjacent electrodes of the second substrate. As a result, the first substrate and the second substrate are integrated.

(Patent Document 1) Japanese Patent Application, First Publication No. Hei 6-21149

(Patent Document 2) Japanese Patent No. 2660943

However, according to the methods described in Patent Documents 1 and 2, a space is formed between the bonding layer and the substrate because the composition has poor fluidity, causing problems such as poor adhesion of the bonding layer to the second substrate, and thus sufficient mounting reliability of the connection portion cannot be obtained.

DISCLOSURE OF THE INVENTION

Under the above circumstances, the present invention has been completed, and an object thereof is to provide a technique capable of forming a resin layer which is excellent in fluidity upon heat bonding and also has excellent adhesion as well as bonding properties and/or sealing properties, after pattern formation, in a photosensitive thermosetting resin composition used as a permanent film.

To achieve the above object, the present invention employs the following compositions.

A first aspect is a chemically amplified positive photosensitive thermosetting resin composition comprising a reaction product of (A) an alkali soluble resin and (C) a crosslinking polyvinyl ether compound, (B) a compound generating an acid under irradiation with radiation, and (D) an epoxy resin.

A second aspect is a chemically amplified positive photosensitive thermosetting resin composition comprising (A) an alkali soluble resin, (B) a compound generating an acid under irradiation with radiation, (C) a crosslinking polyvinyl ether compound, and (D) an epoxy resin.

A third aspect is a method for formation of a cured article, which comprises applying the chemically amplified positive photosensitive thermosetting resin composition of the present invention, subjecting to prebaking, subjecting to selective exposure, subjecting to PEB (post-exposure baking) and subjecting to alkali development to form a resist pattern, followed by melting with heating and further heat curing.

A fourth aspect is a cured article obtainable by the method of the third aspect.

A fifth aspect is a method for production of a functional device, which comprises forming a resist pattern of and curing the chemically amplified positive photosensitive thermosetting resin composition of the present invention.

A sixth aspect is a functional device obtainable by the method of the fifth aspect.

EFFECTS OF THE INVENTION

The present invention provides a photosensitive thermosetting resin composition used as a permanent film, capable of forming a resin layer which is excellent in fluidity upon heat bonding and also has excellent adhesion as well as bonding properties and/or sealing properties, after pattern formation.

BEST MODE FOR CARRYING OUT THE INVENTION

Figure 1:
FIG. 1 a schematic diagram for explaining a process of a method for production of a circuit element.

Chemically Amplified Positive Photosensitive Thermosetting Resin Composition

First Embodiment

The first embodiment of the chemically amplified positive photosensitive thermosetting resin composition according to the present invention contains a reaction product of (A) an alkali soluble resin and (C) a crosslinking polyvinyl ether compound, (B) a compound generating an acid under irradiation with radiation, and (D) an epoxy resin.

(A) Alkali Soluble Resin

The component (A) is not specifically limited and can be optionally selected from those which are commonly used as a coating film forming material in a chemically amplified positive photosensitive resin composition. The component preferably has a phenolic hydroxyl group, and examples thereof include novolak resin obtained by condensing an aromatic hydroxy compound with aldehydes or ketones, polyhydroxystyrene and its derivatives (for example, hydroxystyrene resins).

Examples of the aromatic hydroxy compound include phenol; cresols such as m-cresol, p-cresol and o-cresol; xylenols such as 2,3-xylenol, 2,5-xylenol, 3,5-xylenol and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol and 2-tert-butyl-5-methylphenol; alkoxyphenols such as p-methoxyphenol, m-methoxyphenol, p-ethoxyphenol, m-ethoxyphenol, p-propoxyphenol and m-propoxyphenol; isopropenylphenols such as o-isopropenylphenol, p-isopropenylphenol, 2-methyl-4-isopropenylphenol and 2-ethyl-4-isopropenylphenol; arylphenols such as phenylphenol; and polyhydroxyphenols such as 4,4'-dihydroxybiphenyl, bisphenol A, resorcinol, hydroquinone and pyrogallol. These aromatic hydroxy compounds may be used alone or in combination.

Examples of the aldehydes include formaldehyde, paraformaldehyde, trioxane, acetaldehyde, propionealdehyde, butylaldehyde, trimethylacetaldehyde, acrolein, crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde and cinnamic acid aldehyde. These aldehydes may be used alone or in combination.

Among these aldehydes, formaldehyde is preferable in view of availability, and it is particularly preferable to use hydroxybenzaldehydes in combination with formaldehyde so as to improve heat resistance of the cured articles of the composition of this embodiment.

Examples of the ketones include acetone, methyl ethyl ketone, diethyl ketone and diphenyl ketone. These ketones may be used alone or in combination. Furthermore, aldehydes may be appropriately used in combination with ketones.

The condensation reaction product of the aromatic hydroxy compound and the aldehydes or ketones can be prepared by a conventionally known method in the presence of an acidic catalyst. As the acidic catalyst, for example, hydrochloric acid, sulfuric acid, formic acid, oxalic acid and paratoluenesulfonic acid can be used.

Examples of the polyhydroxystyrene and derivatives thereof include a homopolymer of vinylphenol, and a copolymer of vinylphenol and a comonomer which is copolymerizable with vinylphenol. Examples of the comonomer include acrylic acid derivative, acrylonitrile, methacrylic acid derivative, methacrylonitrile, and styrene derivatives such as styrene, α-methylstyrene, p-methylstyrene, o-methylstyrene, p-methoxystyrene and p-chlorostyrene.

Among these, examples of the resin suited for use as the component (A) include novolak resin, (poly)hydroxystyrene resin and styrene-hydroxystyrene copolymer.

When using a novolak resin as the component (A), Mw is preferably from about 1000 to 50000, and more preferably from about 1000 to 20000, in view of sensitivity behavior. Mw is still more preferably from 2000 to 15000. Mw is preferably within the above range in view of heat resistance, rectangularity of pattern, dependence of resist profile on pattern, resolving power and sensitization.

When using a novolak resin as the component (A), it is preferred to use a basic compound (D) and a storage stabilizer, which are described hereinafter, in combination, in view of long-term storage stability of the composition of the present invention.

When using a hydroxystyrene resin as the component (A), the content of a hydroxystyrene unit is preferably 50 mol % or more, and more preferably 70 mol % or more, in view of reactivity of the component (C).

Particularly, the hydroxystyrene resin is a resin which has less acidity as compared with the novolak resin. Since the acidity of the component (A) exerts an adverse influence on storage stability of the composition of the present invention, hydroxystyrene resins are preferably selected for the purpose of preparing a composition having excellent storage stability. Among these hydroxystyrene resins, a hydroxystyrene resin having a styrene constituent unit derived from the above styrene and styrene derivative, and an alkyl-substituted styrene constituent unit (both are referred to as a "styrene constituent unit") is preferable because it has the effect of improving sensitivity and heat resistance of the composition of the present invention as well as resist pattern profile.

The content of the styrene constituent unit is preferably from 1 to 30 mol %, and more preferably from 5 to 15 mol %, in view of security of reactivity with the component (C) and improvement in heat resistance and sensitivity.

When using the hydroxystyrene resin as the component (A), Mw is preferably from 1000 to 40000, more preferably from 1000 to 8000, and particularly preferably from 2000 to 6000, in view of heat resistance, sensitization, and stability of the reaction with a crosslinking agent.

As the component (A), one or more kinds of materials can be used.

Component (C)

The component (C) is a crosslinking polyvinyl ether compound and acts as a crosslinking agent for the component (A).

It is presumed that a crosslinking polyvinyl ether compound as the component (C) exerts the following action.

That is, the component (C) is crosslinked with the component (A) to form a reaction product. Depending on the degree of the reaction with the reaction product, the crosslinking reaction with the component (A) proceeds due to heating upon prebaking to form an alkali-insolubilized resist layer on the entire surface of the substrate. Then, crosslinking is decomposed by an action of an acid generated from the component (B) upon exposure, and thus the exposed area becomes alkali soluble while the unexposed area remains alkali insoluble. As described hereinafter, in the heating step of crosslinking the component (D) in the unexposed area after formation of a resist pattern, crosslinking between the component (C) and the component (A) is decomposed, so that the unexposed area is softened and the pattern is fluidized, and thus the composition is finally cured by the crosslinking reaction of the component (D).

Therefore, the component (C) is not specifically limited as long as it has such a function.

Various compounds as the component (C) are specifically listed in Japanese Patent Application, First Publication No. Hei 6-148889 and Japanese Patent Application, First Publication No. Hei 6-230574, and can be used after selecting therefrom. Particularly preferred is a compound etherified by substituting hydrogen atoms of portion or all of hydroxyl groups of an alcohol represented by the following general formula:

$$Rn\text{-}(OH)n \quad (I)$$

wherein Rn is a group formed by eliminating n hydrogen atoms from a linear, branched or cyclic alkane group and may have a substituent, and an oxygen bond (ether bond) may exist in the alkane, and n represents an integer of 2, 3 or 4, with a vinyl group taking account of resist profile involved in heat crosslinking properties and decomposition due to acid as well as contrast between the exposed area and the unexposed area. Specific examples thereof include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether and cyclohexane dimethanol divinyl ether. Among these compounds, a crosslinking divinyl ether compound is more preferable.

The divinyl ether compound is preferably represented by the following general formula (1) is also preferable.

$$H_2C=CH\text{—}O\text{—}R^1\text{—}O\text{—}CH=CH_2 \quad (1)$$

In the above general formula (1), $R^1$ is a branched or linear alkylene group having 1 to 10 carbon atoms which may have a substituent, or a divalent group represented by the following general formula (2).

The alkylene group may have an oxygen bond (ether bond) on the main chain.

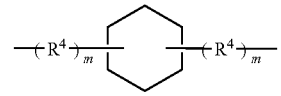

(2)

In the general formula (2), $R^4$ is also a branched or linear alkylene group having 1 to 10 carbon atoms which may have a substituent, and the alkylene group may have an oxygen bond (ether bond) on the main chain. m is 0 or 1. $R^1$ is preferably —$C_4H_8$—, —$C_2H_4OC_2H_4$—, —$C_2H_4OC_2H_4OC_2H_4$—, or a substituent represented by the general formula (2). Among these compounds, a compound represented by the general formula (2) is preferable and a compound wherein $R^4$ has one carbon atom and m is 1 (the compound represented by the general formula (1) is cyclohexane dimethanol divinyl ether [hereinafter abbreviated as CHDVE]) is particularly preferable.

As the component (C), one or more kinds of components can be used alone or in combination.

Reaction Product of Components (A) and (C)

The reaction product of components (A) and (C) (hereinafter referred to as a component (a)) will now be described.

Component (a)

The component (a) is a reaction product obtained by reacting the component (A) with the component (C), and is slightly soluble or insoluble in an aqueous alkali solution and is made soluble by an action of an acid component.

When the component (A) is reacted with the component (C) having a vinyl group at both ends, there can be obtained a reaction product having such a constituent unit that a vinyl group at one end of the component (C) is linked to a phenolic hydroxyl group in the side chain of the component (A).

Specific examples of the constituent unit include constituent unit represented by the following general formula (1A) and constituent unit represented by the following general formula (2A).

When the component (A) is reacted with the component (C), there can be obtained a reaction product having such a moiety that vinyl groups at both ends of the component (C) are linked to two phenolic hydroxyl groups in the side chain in the component (A). Specific examples of the constituent unit include intermolecular crosslinked moiety represented by the following general formula (1B) and intermolecular crosslinked moiety represented by the following general formula (2B).

Usually, a reaction product (a) having both a constituent unit wherein only one end of the component (C) is linked (for example, (1A) and (2A)) and a constituent unit wherein both ends are linked (for example, (1B) and (2B)) is obtained.

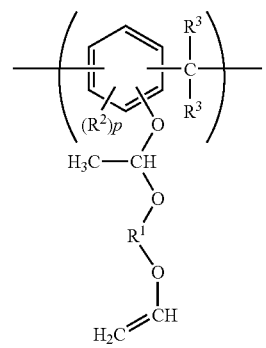

(1A)

-continued

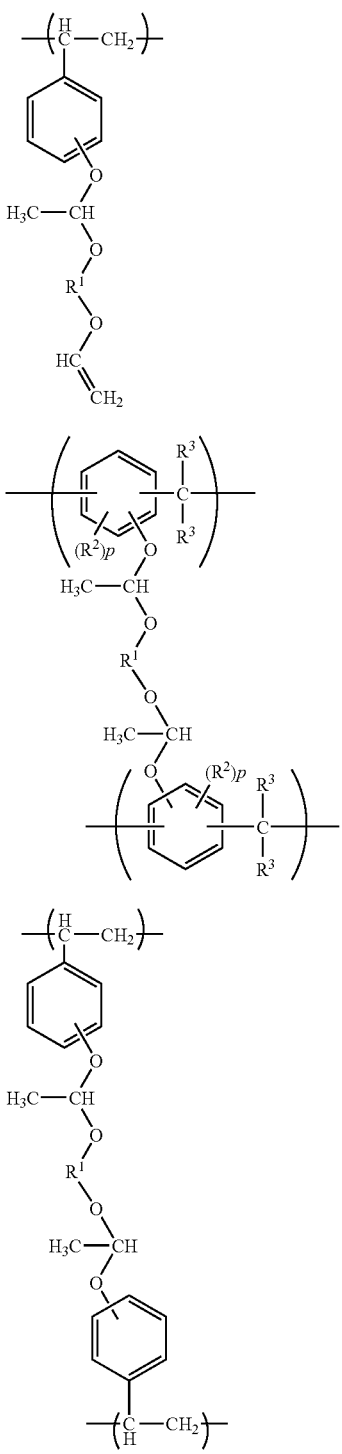

In the above formulas, $R^1$ is as defined above, $R^2$ and $R^3$ each independently represents a hydrogen atom, or a linear or branched alkyl or aryl group having 1 to 3 carbon atoms, $R^2$ is preferably a hydrogen atom or a methyl group, $R^3$ is preferably a hydrogen atom, a propyl group or a hydroxyphenyl group, and p is an integer of 1 to 3.

The component (a) in this example can be preferably obtained by reacting the component (A) with the component (C) in the substantial absence of an acid catalyst.

When the component (C) is previously linked to hydroxyl groups in the side chain of the alkali soluble resin (A), change over time of this composition is suppressed to obtain a material with less change in sensitivity. When the composition is applied and then heated, the unreacted phenolic hydroxyl groups in the side chain of the component (a) are reacted with terminal vinyl groups of the constituent unit (1A) or (2A) to form a crosslinked structure. Consequently, the coating film made of this composition becomes slightly soluble or insoluble in an aqueous alkali solution such as alkali developer solution used to form a resist pattern.

When the component (a) having the crosslinked structure is reacted with an acid generated from the component (B) during exposure, the crosslinked structure is cleaved and thus solubility of the component (a) in the aqueous alkali solution is enhanced.

When the novolak resin is selected as the component (A), since the reaction between the components (A) and (C) proceeds without using an acid catalyst, the use of the acid catalyst is not essential, while the presence of the acid component in the reaction system is not preferable in view of storage stability after preparation. When the hydroxystyrene resin is selected as the component (A), since the concentration of the acid component must be severely controlled in the reaction between the components (A) and (C), the presence of impurities such as acid component in the component (A) is not preferable. Therefore, it is preferred to severely performing the operation of removing the acid component contained in the component (A), before reacting with the component (C).

The acid component is, for example, an acid catalyst used to synthesize a novolak resin, or an organic acid such as free acid which exists in the reaction solvent, and can be analyzed by gas chromatography.

Examples of the method of removing the acid component include conventionally known methods, for example, use of ion exchange resin, washing with pure water, and neutralization with alkali.

The concentration of the acid component in the component (A) before the reaction with the component (C) is preferably adjusted to 0.1 ppm or less, and particularly preferably 0.01 ppm or less.

The weight-average molecular weight of the component (a) obtained by reacting the component (A) with the component (C) is preferably adjusted within a range from 10000 to 70000, and particularly preferably from 20000 to 50000, when the novolak resin is selected as the component (A), or preferably adjusted within a range from 30000 to 150000, and particularly preferably from 40000 to 100000, when the hydroxystyrene resin is selected as the component (A) in view of heat resistance.

When the novolak resin is selected as the component (A), the component (C) is used in the amount of 1 to 30% by weight, and preferably from 5 to 15% by weight, based on 100 parts by weight of the component (A). When the amount is less than 1% by weight, reduction in film thickness of the unexposed area of the resist pattern increases and thus contrast of the resist pattern tends to deteriorate. On the other hand, when the amount exceeds 15% by weight, solubility in the developer solution (aqueous alkali solution) tends to drastically deteriorate, thus causing a problem that sensitivity is poor and resolution of a pattern is not achieved. When the hydroxystyrene resin is selected as the component (A), the component (C) is used in the amount of 1 to 30% by weight, preferably 5 to 15% by weight, based on the component (A).

(B) Compound Generating an Acid Under Irradiation with Radiation (Photoacid Generator)

The component (B) is not specifically limited and there can be used photoacid generators which have conventionally been known as the material of the chemically amplified positive photosensitive resin composition, for example, sulfonylazomethane photoacid generators, onium salt photoacid generators and oxime sulfonate photoacid generators.

Particularly in the permanent film, ultraviolet light in which g-rays, h-rays and i-rays coexist is sometimes used. The component (B) is preferably a compound with high acid generation efficiency when irradiated with ultraviolet light. Since i-rays having a short wavelength are used so as to improve resolution, a compound with high acid generation efficiency to i-ray exposure is preferable.

As the component (B), for example, compounds represented by the following general formulas (V) and (VI) are preferably used because of high acid generation efficiency to i-ray exposure.

Compounds represented by the following formulas:

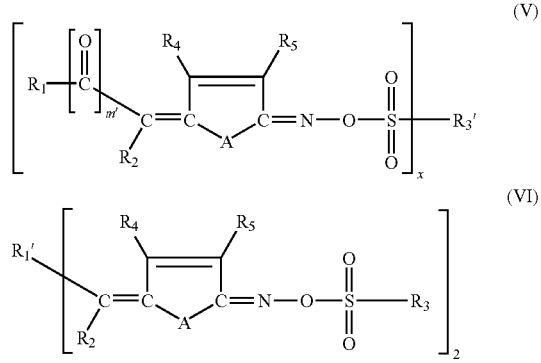

wherein m' represents 0 or 1; X represents 1 or 2; $R_1$ is a phenyl group which may be substituted with one or more $C_1$-$C_{12}$ alkyl groups, or a heteroaryl group, or, when m' is 0, $R_1$ may further be a $C_2$-$C_6$ alkoxycarbonyl group, a phenoxycarbonyl group or CN; $R_1'$ represents a $C_2$-$C_{12}$ alkylene group; $R_2$ has the same meaning as in $R_1$; $R_3$ represents a $C_1$-$C_{18}$ alkyl group; $R_3'$ has the same meaning as in $R_3$ when X=1, or a $C_2$-$C_{12}$ alkylene group or a phenylene group when X=2; $R_4$ and $R_5$ each independently represents a hydrogen atom, a halogen, or a $C_1$-$C_6$ alkyl group; A represents S, O or $NR_6$; and $R_6$ represents a hydrogen atom or a phenyl group (see U.S. Pat. No. 6,004,724). Specific examples thereof include thiolene-containing oxime sulfonate represented by the following formula (VII):

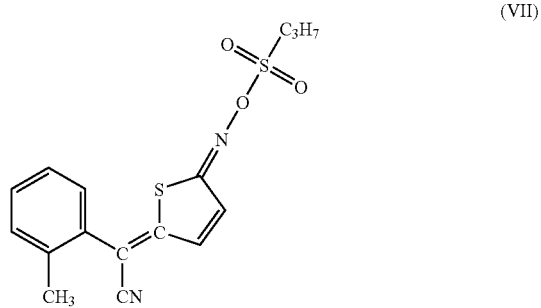

a bis(trichloromethyl)triazine compound represented by the following formula (VIII):

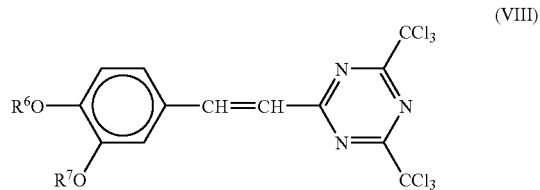

wherein $R^6$ and $R^7$ each represents an alkyl group having 1 to 3 carbon atoms, or a combination of the compound (VIII) and a bis(trichloromethyl)triazine compound represented by the following formula (IX):

wherein Z represents a 4-alkoxyphenyl group (see Japanese Patent Application, First Publication No. Hei 6-289614 and Japanese Patent Application, First Publication No. Hei 7-134412).

Specific examples of the triazine compound (VIII) include 2-[2-(3,4-dimethoxyphenyl)ethenyl]-4,6-bis(trichloromethyl)-1,3,5-triazine, 2-[2-(3-methoxy-4-ethoxyphenyl)ethenyl]-4,6-bis(trichloromethyl)-1,3,5-triazine, 2-[2-(3-methoxy-4-propoxyphenyl)ethenyl]-4,6-bis(trichloromethyl)-1,3,5-triazine, 2-[2-(3-ethoxy-4-methoxyphenyl)ethenyl]-4,6-bis(trichloromethyl)-1,3,5-triazine, 2-[2-(3,4-diethoxyphenyl)ethenyl]-4,6-bis(trichloromethyl)-1,3,5-triazine, 2-[2-(3-ethoxy-4-propoxyphenyl)ethenyl]-4,6-bis(trichloromethyl)-1,3,5-triazine, 2-[2-(3-propoxy-4-methoxyphenyl)ethenyl]-4,6-bis(trichloromethyl)-1,3,5-triazine, 2-[2-(3-propoxy-4-ethoxyphenyl)ethenyl]-4,6-bis(trichloromethyl)-1,3,5-triazine and 2-[2-(3,4-dipropoxyphenyl)ethenyl]-4,6-bis(trichloromethyl)-1,3,5-triazine. These triazine compounds may be used alone or in combination.

Examples of the triazine compound (IX), which is optionally used in combination with the triazine compound (VIII), include 2-(4-methoxyphenyl)-4,6-bis(trichloromethyl)-1,3,5-triazine, 2-(4-ethoxyphenyl)-4,6-bis(trichloromethyl)-1,3,5-triazine, 2-(4-propoxyphenyl)-4,6-bis(trichloromethyl)-1,3,5-triazine, 2-(4-butoxyphenyl)-4,6-bis(trichloromethyl)-1,3,5-triazine, 2-(4-methoxynaphthyl)-4,6-bis(trichloromethyl)-1,3,5-triazine, 2-(4-ethoxynaphthyl)-4,6-bis(trichloromethyl)-1,3,5-triazine, 2-(4-propoxynaphthyl)-4,6-bis(trichloromethyl)-1,3,5-triazine, 2-(4-butoxynaphthyl)-4,6-bis(trichloromethyl)-1,3,5-triazine, 2-(4-methoxy-6-carboxynaphthyl)-4,6-bis(trichloromethyl)-1,3,5-triazine, 2-(4-methoxy-6-hydroxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(5-ethyl-2-furyl)ethenyl]-4,6-bis(trichloromethyl)-1,3,5-triazine, 2-[2-(5-propyl-2-furyl)ethenyl]-4,6-bis (trichloromethyl)-1,3,5-triazine, 2-[2-(3,5-dimethoxyphenyl)ethenyl]-4,6-bis(trichloromethyl)-1,3,5-triazine, 2-[2-(3-methoxy-5-ethoxyphenyl)ethenyl]-4,6-bis(trichloromethyl)-1,3,5-triazine, 2-[2-(3-methoxy-5-propoxyphenyl)ethenyl]-4,6-bis(trichloromethyl)-1,3,5-triazine, 2-[2-(3-ethoxy-5-methoxyphenyl)ethenyl]-4,6-bis(trichloromethyl)-1,3,5-triazine, 2-[2-(3,5-diethoxyphenyl)ethenyl]-4,6-bis(trichloromethyl)-1,3,5-triazine, 2-[2-(3-ethoxy-5-propoxyphenyl)ethenyl]-4,6-bis(trichloromethyl)-1,3,5-triazine, 2-[2-(3-propoxy-5-methoxyphenyl)ethenyl]-4,6-bis(trichloromethyl)-1,3,5-triazine, 2-[2-(3-propoxy-5-ethoxyphenyl)ethenyl]-4,6-bis(trichloromethyl)-1,3,5-triazine, 2-2-(3,5-dipropoxyphenyl)ethenyl]-4,6-bis(trichloromethyl)-1,3,5-triazine, 2-(3,4-methylenedioxyphenyl)-4,6-bis(trichloromethyl)-1,3,5-triazine and 2-[2-(3,4-methylenedioxyphenyl)ethenyl]-4,6-bis(trichloromethyl)-1,3,5-triazine. These triazine compounds may be used alone or in combination.

There is also exemplified a compound represented by the following formula (X):

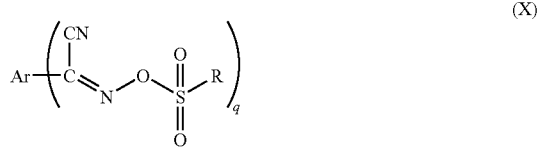

wherein Ar represents a substituted or unsubstituted phenyl group or a naphthyl group; R represents a $C_1$ to $C_9$ alkyl group; and q represents an integer of 2 or 3. These compounds may be used alone or in combination. Among these compounds, a compound represented by the formula (VII) and a compound represented by the following formula (XI) are preferably used because they are excellent in acid generation efficiency to i-rays.

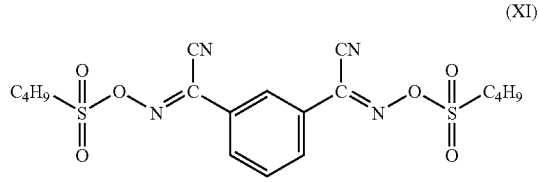

In this embodiment, one or more kinds of the components (B) can be used in combination.

The amount of the component (B) is from 0.1 to 30 parts by weight, and preferably from 0.1 to 10 parts by weight, based on 100 parts by weight of the component (A).

(D) Epoxy Resin

As described hereinafter, the component (D) forms a crosslinked structure when a chemically amplified positive photosensitive thermosetting resin composition is applied, prebaked to form a resist pattern and then postbaked under relatively high temperature conditions.

As the component (D), an oligomer of a thermosetting resin before curing (oligomer before forming a crosslinked structure) is preferably used.

The component (D) is, for example, a reaction product of bisphenol A and epichlorohydrin.

The component (D) is excellent in bonding properties and, as described above, it is preferable because it has such properties that curing (crosslinking) does not proceed upon prebaking and PEB (post-exposure baking) and curing (crosslinking) proceeds upon postbaking.

By adding the component (D), heat curability is imparted. By hot melting (fluidization) due to the component (C) after patterning as well as heat curing process, adhesion is improved.

The component (D) is not specifically limited and there can be used conventionally known ones described in Japanese Patent Application, Second Publication No. Hei 7-17737. Specific examples thereof include glycidyl ether type, glycidyl ester type, glycidylamine type, alicyclic type, bisphenol A type (including brominated bisphenol A type, hydrogenated bisphenol A type and bisphenol AF type), bisphenol F type, bisphenol S type, biphenyl type, naphthalene type, fluorene type, phenol novolak type and ortho-cresol type epoxy resins, and these resins can be used regardless of the softening point and structure. Among these resins, bisphenol A type epoxy resin and bisphenol F type epoxy resin are preferable.

The component (D) may be soluble or slightly soluble in an organic solvent to be used. When it is slightly soluble (inert to or slightly soluble in an organic solvent), the component is preferably in the form of fine particles in view of dispersibility. In the case of fine particles, the particle size is preferably 50 µm or less, and more preferably 30 µm or less. When the particle size is within the above range, coatability is improved and thus pinholes of the coating film surface and roughness of the coating film surface can be suppressed.

In view of coatability, the component (D) is preferably in the form of liquid. When using the component (D) in the form of liquid, film forming properties after prebake deteriorate and the exposure step upon formation of a resist pattern may become unstable. However, in the resin composition of this embodiment, a crosslinked structure of the components (A) and (C) is formed in the resist coating film and a film having high hardness can be formed, and thus film forming properties are excellent and stable exposure can be conducted.

The smaller the molecular weight of the component (D) the better so as to reduce an influence on alkali development. In the case of bisphenol A, the molecular weight is preferably from 200 to 6000, and more preferably from 200 to 1000. The molecular weight is a weight-average molecular weight as measured by GPC using polystyrene standards.

The amount of the component (D) is preferably from 50 to 200 parts by weight, more preferably from 70 to 150 parts by weight, and particularly preferably about 100 parts by weight, based on 100 parts by weight of the component (A). Since sufficient heat curability can be imparted by controlling the amount to the lower limit or more, sufficient effect can be obtained. It is assumed that the phenolic hydroxyl groups of the component (A) are reacted with the component (D) at the time of heat curing. When excess phenolic hydroxyl groups are remained, various properties suited for use as an insulating material, for example, heat resistance and water absorption resistance may deteriorate. By controlling the amount of the component (D) to the lower limit or more, such deterioration can be prevented. Various properties suited for use as an insulating material, for example, heat resistance and water absorption resistance may deteriorate when excess phenolic hydroxyl groups remain. By controlling the amount to the upper limit or less, such deterioration can be prevented.

In the chemically amplified positive photosensitive thermosetting resin composition of this embodiment, various additives can be added, in addition to the above essential components.

Examples of additives include curing accelerators of the component (D), fillers and quenchers.

Curing Accelerators

The curing accelerators also include those used as so-called curing agents.

As the curing accelerators of the component (D), polymerization addition type (polyamine, acid anhydride, polyphenol, polymercaptan, isocyanate and organic acid), catalyst type [heat curing type (amine (preferably tertiary amine), imidazole and Lewis acid) and ultraviolet curing type (Bronsted acid salt)] and condensation type (phenol resin, urea resin and melamine resin) accelerators are known and accelerators can be optionally used in the composition of this embodiment among these accelerators.

For example, Japanese Patent Application, Second Publication No. Hei 7-17737 describe the following specific examples:

imidazole derivatives manufactured by Shikoku Corp. under the trade names of 2MZ, 2E4MZ, $C_{11}Z$, $C_{17}Z$, 2PZ, 1B2MZ, 2MZ-CN, 2E4MZ-CN, $C_{11}Z$-CN, 2PZ-CN, 2PHZ-CN, 2MZ-CNS, 2E4MZ-CNS, 2PZ-CNS, 2MZ-AZINE, 2E4MZ-AZINE, $C_{11}Z$-AZINE, 2MA-OK, 2P4MHZ, 2PHZ and 2P4BHZ; guanamines such as acetoguanamine, benzoguanamine and 3,9-bis[2-(3,5-diamino-2,4,6-triazaphenyl)ethyl] 2,4,8,10tetraoxaspiro[5,5]undecane; polyamines such as diaminodiphenylmethane, m-phenylenediamine, diaminodiphenylsulfone, cyclohexylamine, m-xylylenediamine, 4,4'-diamino-3,3'-diethyldiphenylmethane, diethylenetriamine, tetraethylenepentamine, N-aminoethylpiperazine, isophoronediamine, dicyandiamide, urea, urea derivative, melamine and polybasic hydrazide, and organic acid salts and/or epoxy adducts thereof; amine complexes of boron trifluoride; tertiary amines such as trimethylamine, triethanolamine, N,N-dimethyloctylamine, N,N-dimethylaniline, N-benzyldimethylamine, pyridine, N-methylpyridine, N-methylmorpholine, hexamethoxymethylmelamine, 2,4,6-tris(dimethylaminophenol), N-cyclohexyldimethylamine, tetramethylguanidine and m-aminophenol; polyphenols such as polyvinylphenol, brominated polyvinylphenol, phenol novolak and alkylphenol novolak; organic phosphines such as tributylphosphine, triphenylphosphine and tris-2-cyanoethylphosphine; phosphonium salts such as tri-n-butyl(2,5-dihydroxyphenyl)phosphonium bromide and hexadecyltributylphosphonium chloride; quaternary ammonium salt such as benzyltrimethylammonium chloride, phenyltributylammonium chloride and benzyltrimethylammonium bromide; aforementioned polybasic anhydrides; photocationic polymerization catalysts such as diphenyliodonium tetrafluoroborate, triphenylsulfonium hexafluoroantimonate, 2,4,6-triphenylthiopyrylium hexafluorophosphate, and Irgacure 261 manufactured by CIBA-GEIGY Corporation; and styrene-maleic acid resin.

One or more kinds of these accelerators can be used in combination in the composition of this embodiment.

Among these accelerators, basic compounds such as amines (polyamine, low molecular weight amine (primary, secondary or tertiary amine (preferably secondary or tertiary amine))) are preferable because they also serve as a quencher and a storage stabilizer, as described hereinafter. They are also preferable because they accelerate condensation between phenolic hydroxyl groups of the component (A) and epoxy groups of the component (D).

The amount is the same as that of the basic compound which serves as the quencher and the storage stabilizer described hereinafter, and it is not necessary to add the basic compound if amines (preferably secondary or tertiary amine) are added as the curing accelerator. In other words, it is very advantageous to add the basic compound as a quencher, which is conventionally added in the chemically amplified positive photosensitive resin composition, in view of the cost, because it also serves as the curing accelerator of the component (D).

The amines are not specifically limited as long as they have compatibility with the resin composition and examples thereof include compounds described in Japanese Patent Application, First Publication No. Hei 9-6001.

Specific examples thereof include secondary or tertiary alkanolamine such as diethanolamine, triethanolamine, tributanolamine or triisopropanolamine; and secondary or tertiary alkylamine such as diethylamine, triethylamine, dibutylamine, tributylamine, tri-n-pentylamine, methyl-di-n-octylamine, tri-n-decylamine, tribenzylamine or N,N-dicyclohexylmethylamine.

Among these amines, secondary amine and tertiary amine are preferable. In particular, comparatively bulky amines such as tri-n-pentylamine, methyl-di-n-octylamine, tri-n-decylamine, tribenzylamine and N,N-dicyclohexylmethylamine are preferable in view of an improvement in long-term storage stability because they exert the effect of suppressing the amount of the acid component produced as by-product in this composition over time.

One or more kinds of curing accelerators can be used in combination.

The curing accelerator is preferably added in the amount of 0.01 to 5.0 parts by weight, and particularly preferably from 0.1 to 1.0 parts by weight, based on 100 parts by weight of the solid content of the resin in view of the effect. By adjusting the amount to the upper limit or less, deterioration of fluidity upon bonding can be prevented.

Fillers

If necessary, fillers can be added to the composition of this embodiment for the purpose of improving properties such as adhesion and hardness, especially heat resistance. Any of inorganic fillers and organic fillers can be used, and inorganic fillers are preferable.

Specifically, there can be used conventionally known inorganic fillers such as barium sulfate, barium titanate, silicon oxide powder, fine powdered silicon oxide, silica (preferably amorphous silica), talc, clay, magnesium carbonate, calcium carbonate, aluminum oxide, aluminum hydroxide and mica powder. Among these inorganic fillers, silica is preferably used in view of improvement in heat resistance because they have a high thermal conductivity and can reduce a thermal expansion coefficient.

The amount is preferably 100 parts by weight or less, preferably from 10 to 100 parts by weight, and more preferably 30 to 70 parts by weight, based on 100 parts by weight of the solid content in this composition. Sufficient effect can be exerted by adjusting the amount to the lower limit or more, and deterioration of light transmittance can be prevented by adjusting the amount to the upper limit or less.

Basic Compound

In the composition of this embodiment, it is preferred to add a basic compound (preferably amines) so as to reduce an adverse influence of the acid component. When using the novolak resin as the component (A), since the novolak resin is a resin which exhibits acidity, it is effective to add the basic compound.

This basic compound serves as a quencher and is preferably added in view of an improvement in resolution and pattern profile.

Preferable examples and amount thereof are the same as those in the case of the curing accelerators.

If necessary, the following storage stabilizers may be added to the composition of this embodiment.

The storage stabilizer is not specifically limited as long as it has an action of suppressing the decomposition reaction of the solvent and examples thereof include antioxidants described in Japanese Patent Application, First Publication No. Sho 58-194834. As the antioxidant, phenolic compounds and amine compounds are known. Among these compounds, phenolic compounds are preferable and 2,6-di(tert-butyl)-p-cresol and its derivative are particularly effective so as to prevent deterioration of ester solvents and ketone solvents and also are excellent in view of availability, low cost and excellent storage stabilization effect. They are particularly excellent in deterioration preventing effect to propylene glycol monoalkyl ether acetate and 2-heptanone.

The amount is preferably from 0.01 to 3 parts by weight, and particularly preferably from 0.1 to 1.0 parts by weight, based on 100 parts by weight of the solid content of the resin.

As long as the object of the present invention is not adversely affected, conventional additives having compatibility, for example, additive resins, plasticizers, stabilizers and surfactants for improving performances of the coating film of the photosensitive composition, colorants for further visualizing the developed images, sensitizers for improving the sensitization effect, antihalation dyes, and adhesion modifiers can be added to the composition of this embodiment.

Also acid anhydrides can be added as quenchers.

The concentration of the acid component in the composition of this embodiment is adjusted to 50 ppm or less, and preferably 10 ppm or less. The closer to zero, the more preferable, and thus there is no technical meaning in limitation of the lower value and the concentration is substantially 1 ppm or more.

As described above, concentration of the acid component in this photoresist composition can be adjusted by performing a treatment of decreasing the concentration of the acid component in the component (A) to be as small as possible, using an organic solvent containing no free acid, using an organic solvent which is less likely to generate an acid component due to the decomposition reaction, using a specific basic compound, or using a storage stabilizer.

Consequently, the composition wherein the concentration of the acid component in the resist composition is suppressed to 50 ppm or less is excellent in long-term storage stability.

Method for Preparation of Composition

The composition of this embodiment is preferably in the form of liquid (solution or dispersion) which is prepared by dissolving or dispersing a reaction product of the components (A) and (C), the component (B), the component (D) and optional components, which may be optionally added, in an organic solvent. When the component (D) is slightly soluble, a dispersion is obtained.

A dry film can also be obtained by applying the composition on a supporting film, drying the composition to form a photosensitive thermosetting resin layer, and laminating a protective film on the resin layer. In this case, examples of the protective film include PET (polyethylene terephthalate) film, polyethylene film and polypropylene film. The thickness is not specifically limited as long as the space can be sufficiently filled or sealed, and is commonly from 5 to 200 μm.

The dry film is used in the following manner. First, the protective film is removed and the exposed resin layer side is contacted with the material to be treated (substrate, element), and then the film is adhered on the material to be treated by means of a treatment such as heat bonding. The resin layer is exposed via a mask exposure or directly patternwise exposed and, after removing a supporting film, a pattern is formed by a development treatment. More specific pattern forming methods will be described hereinafter.

Organic Solvent

The organic solvent is not specifically limited as long as it can be used in the chemically amplified positive photosensitive resin composition.

Examples thereof include ester solvents such as propylene glycol monoalkyl ether acetate (for example, propylene glycol monomethyl ether acetate (PGMEA)), lactate ester (for example, ethyl lactate); and non-ester solvents, for example, ketones such as acetone, methyl ethyl ketone, cyclohexanone, methyl isoamyl ketone and 2-heptanone; polyhydric alcohols and derivatives thereof, such as ethylene glycol, propylene glycol, diethylene glycol, or monomethyl ether, monoethyl ether, monopropyl ether, monobutyl ether or monophenyl ether thereof; and cyclic ethers such as dioxane.

The ester solvent is a reaction product of an organic carboxylic acid and an alcohol and therefore contains an organic carboxylic acid as a free acid. Therefore, a non-ester solvent containing no free acid is preferably selected in the composition containing the above basic compound or the composition containing no storage stabilizer described hereinafter, and ketones (ketone solvents) are particularly preferable. Among these solvents, methyl ethyl ketone and 2-heptanone are particularly preferable in view of coatability and solubility of the component (B).

Both the ester solvents and the non-ester solvents are sometimes decomposed over time to form an acid as a by-product, while the decomposition reaction is suppressed in the presence of the above basic compound or the storage stabilizer described hereinafter. Remarkable effect is exerted in the ester solvents. In the presence of the basic compound and the storage stabilizer, the ester solvents are preferable and PGMEA is particularly preferable.

It has been confirmed that the acid component as by-product produced from the decomposition is formic acid, acetic acid or propionic acid in the case of 2-heptanone.

One or more kinds of organic solvents can be used.

The amount of the organic solvent is not specifically limited, but is commonly from 20 to 80% by weight, preferably 25 to 75% by weight, in terms of the solid content in view of coatability.

Second Embodiment

The composition according to the second embodiment of the present invention contains (A) an alkali soluble resin, (B) a compound generating an acid under irradiation with radiation, (C) a crosslinking polyvinyl ether compound, and (D) an epoxy resin.

The second embodiment is different from the first embodiment in that the components (A) and (C) are added without being reacted.

In this embodiment, when the novolak resin is selected as the component (A), the component (C) is used in the amount within a range from 1 to 50% by weight, and preferably from 5 to 35% by weight, based on the component (A). When the amount is less than 1% by weight, reduction in film thickness of the unexposed area of the resist pattern increases and thus contrast of the resist pattern tends to deteriorate. On the other hand, when the amount exceeds 50% by weight, solubility in a developer solution (aqueous alkali solution) tends to drastically deteriorate, thus causing a problem that sensitivity is poor and resolution of a pattern is not achieved. When the hydroxystyrene resin is selected as the component (A), it is used in the amount within a range from 1 to 50% by weight, and preferably from 5 to 40% by weight, based on the component (A).

Component (B)

The component (B) in this embodiment is the same as in the first embodiment.

Component (D)

The component (D) in this embodiment is the same as in the first embodiment.

Curing Accelerator

The curing accelerator in this embodiment is the same as in the first embodiment.

Basic Compound

The basic compound in this embodiment is the same as in the first embodiment.

Filler

The filler in this embodiment is the same as in the first embodiment.

Other Components

The photoresist composition of this embodiment may contain the other components, which are the same as in the first embodiment, as long as the object of the present invention is not adversely affected.

Method for Preparation of Composition

The photoresist composition of this embodiment can be prepared in the same manner as in the first embodiment using the component (A) subjected to the purification operation.

Organic Solvent

The organic solvent in this embodiment is the same as in the first embodiment.

[Method for Formation of Cured Article]

The method for formation of cured article of the present invention comprises applying the chemically amplified positive photosensitive thermosetting resin composition of the present invention, subjecting to prebaking, subjecting to selective exposure, subjecting to PEB (post-exposure baking) and subjecting to alkali development to form a resist pattern, followed by melting with heating and further heat curing.

Conditions for formation of the resist pattern and various conditions of the process of melting with heating and further heat curing will be described in detail in the following description of the method for production of a functional device. The cured article refers to a solid article obtained by heat-curing under the conditions for acceleration of crosslinking of the component (D) after formation of a pattern, as described above.

The composition of the present invention is a so-called chemically amplified composition and can form a fine pattern under exposure and is therefore suited to form a permanent film which requires fine working.

The composition of the present invention can be used to purposes where a permanent film is formed without any limitation. Specifically, the composition is used as protective solder resists formed on the surface of a circuit board, package materials for protecting elements, underfilling materials which are formed as a cured resin article in the space between an integrated circuit element and a circuit board, reliability of connection being improved by dispersing stress concentrated to the connection portion into the cured resin article; and those used as a bonding layer in a package of parts such as circuit element or the like, or a bonding layer for bonding an integrated circuit element with a circuit board.

[Method for Production of Functional Device]

In the method for production of a functional device of the present invention, the chemically amplified positive photosensitive thermosetting resin composition of the present invention is used.

Functional Device

The functional device means an element and a substrate which are formed and worked by a fine working technique and includes electronic parts such as semiconductor device and circuit board, and examples thereof include optical circuit parts, MEMS (microelectromechanical devices) and composite parts thereof. The cured article of the present invention is preferably suited for use as a permanent film of electronic parts such as a semiconductor device and circuit board and is particularly suited for use as underfilling materials which are formed as a cured resin article in the space between an integrated circuit element and a circuit board, and those used as a bonding layer in a package of parts such as circuit element or the like, or a bonding layer for bonding an integrated circuit element with a circuit board.

The electronic parts are not specifically limited as long as they are parts or finished products to which a permanent film is applied.

In the electronic parts, the composition may be used to form a protective film for protecting a circuit formed on a substrate, like a solder resist, or may be used as a bonding layer for bonding two or more base materials.

For example, when a first base material and a second base material are bonded, the following steps are conducted, the steps comprising applying the composition of the present invention is applied to the area including the bonding portion of the first base material, subjecting to prebaking, selectively exposing the area other than the area corresponding to the above bonding portion, subjecting to PEB (post-exposure baking), and alkali-developing with an aqueous tetramethylammonium hydroxide (TMAH) solution to form a bonding layer (resist pattern).

In the prebaking step, the organic solvent in the composition is removed and the component (C) reacts thereby to form a firm coating film.

Heating is conducted under the following conditions, for example, at a temperature of 90 to 140° C. (preferably 100 to 130° C.) for 5 to 30 minutes (preferably 5 to 15 minutes). By heating under these conditions, removal of the organic solvent and proceeding of the crosslinking reaction due to the component (C) can be conducted with less proceeding of crosslinking of the component (D).

In the selective exposure step, a light source is not specifically limited and radiation such as g-rays, i-rays and h-rays can be used and i-rays are preferably used so as to conduct fine working.

PEB (post-exposure baking) is preferably conducted under the following conditions, for example, at a temperature of 90 to 140° C. (preferably 100 to 130° C.) for 5 to 30 minutes (preferably 5 to 15 minutes). By heating under these conditions, the component (B) can be diffused with less proceeding of crosslinking of the component (D).

Then, using a prescribed aqueous alkali solution as a developer solution, the unnecessary area is dissolved and removed to obtain a prescribed resist pattern. As the developer solution, there can be used aqueous solutions of alkalis such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene and 1,5-diazabicyclo[4,3,0]-5-nonane. Also, an aqueous solution prepared by adding a suitable amount of a water-soluble organic solvent such as methanol or ethanol and a surfactant in an aqueous solution of the above alkalis can be used as the developer solution.

The developing time varies depending on the kind and ratio of the respective components of the composition as well as the dry film thickness of the composition, but is commonly from 1 to 30 minutes. The developing method may be any of a spin method, a dipping method, a puddle method and a spray developing method. After the development, the resulting resist pattern is washed with water for 30 to 90 seconds and then dried using an air gun or an oven.

The bonding layer of the first base material and the second base material are allowed to face each other, and are then subjected to heat bonding, and thus the resist pattern is melted and fluidized, thereby to bond them. Electronic parts can be produced by performing the step of bonding the first base material with the second base material by heat-curing the component (D) in the bonding layer in the postbaking step as well as the underfilling step.

The postbaking step is conducted under the following conditions, for example, at a temperature of 150 to 220° C. (preferably 170 to 200° C.) for 1 to 4 hours (preferably 1.5 to 2.5 hours). By heating under these conditions, the bonding layer is softened and preferably liquefied to fill the space at the beginning of heating and, furthermore, heat curing is caused by the component (D) at any time, and thus adhesion between the base materials is improved.

The reason why the bonding layer is softened at the beginning of the heating is believed to be that the crosslinked structure due to the component (C) is cleaved at high temperature.

The reason why the bonding strength further increases is believed to be that the components (A) and (D) are heat-crosslinked.

Therefore, in this bonding step, when the bonding layer formed on the first base material is heat-bonded with the second base material (adherend), the bonding layer is sufficiently fluidized and conforms to the uneven surface of the adherend, and thus bonding proceeds. Therefore, bonding to the fine uneven surface or the space can be conducted without forming voids.

Sufficient bonding strength (coherent strength) can be achieved by polymerizing the bonding layer due to crosslinking of the component (D).

Typical examples of use as the bonding layer include use wherein, in case of forming a circuit element, two base materials are bonded thereby to physically and electrically connecting electrodes formed on two base materials.

The method for production of a circuit element among the method for production of a functional device will now be described.

Method for Production of Circuit Element

FIGS. 1 to 5 are schematic diagrams for explaining the process of the method for production of a circuit element.

The symbol 1 denotes a first substrate and, as shown in FIG. 1, plural first substrate electrodes 2 as a protrusion such as a bump are provided in parallel at almost the same intervals on the first substrate 1. In this example, the first substrate electrodes 2 are bump-like electrodes of 40 μm in width and the interval between adjacent first substrate electrodes 2 is 40 μm. The height (size in the thickness direction of the first substrate 1) of the first substrate electrodes 2 is 20 μm.

Figure 2:
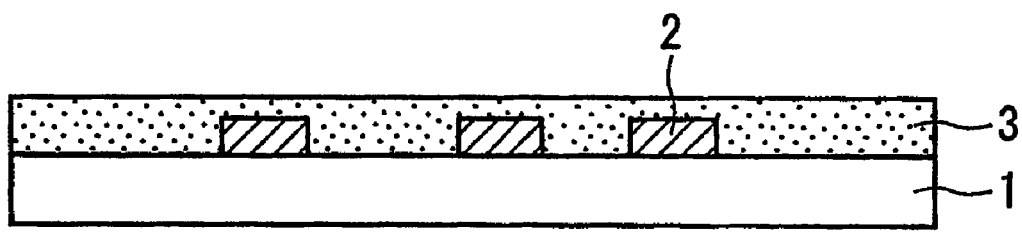
FIG. 2 a schematic diagram for explaining a process of a method for production of a circuit element.

With respect to the first substrate 1, as shown in FIG. 2, the composition of the present invention is applied on the first substrate 1 so as to coat the first substrate electrodes 2, and then prebaked to form a coating layer 3.

Figure 3:
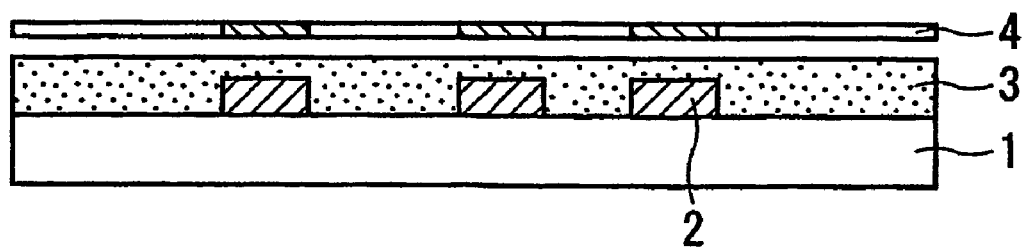
FIG. 3 a schematic diagram for explaining a process of a method for production of a circuit element.
Figure 4:
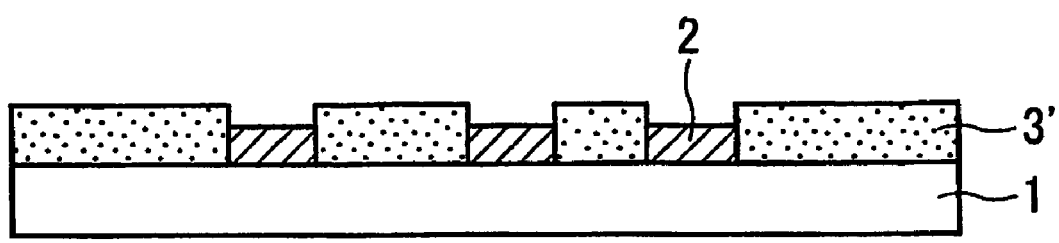
FIG. 4 a schematic diagram for explaining a process of a method for production of a circuit element.

Then, as shown in FIG. 3, the area of the first substrate electrodes 2 is selectively exposed via a mask 4 and developed to selectively form a bonding layer 3' (resist pattern) between adjacent first substrate electrodes 2 as shown in FIG. 4.

The height (size in the thickness direction of the first substrate 1) of the bonding layer 3' thus formed is commonly larger than that of the first substrate electrodes 2. In this example, the height of the bonding layer 3' is 35 μm.

Figure 5:
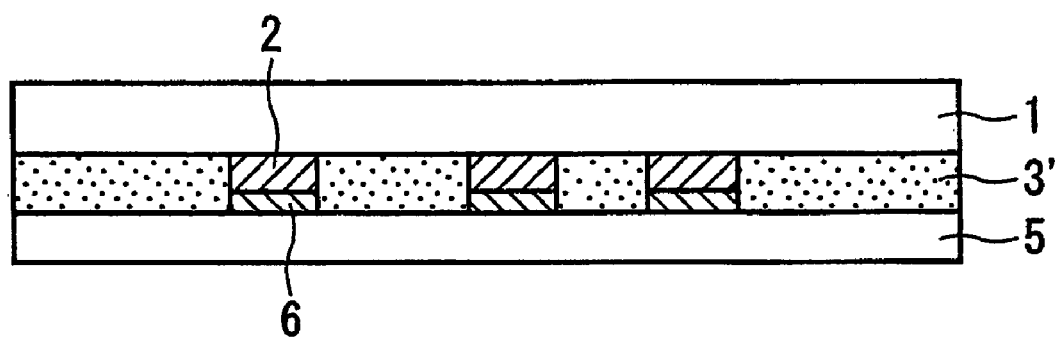
FIG. 5 a schematic diagram for explaining a process of a method for production of a circuit element.

As shown in FIG. 5, a second substrate 5 is prepared. On the second substrate 5, electrodes 6 of the second substrate are formed on the position corresponding to the first substrate electrodes 2 of the first substrate 1.

Then, the first substrate 1 and the second substrate 5 are allowed to face each other, thereby to electrically connect the first substrate electrodes 2 of the first substrate 1 with the second substrate electrodes 6 of the second substrate 5. At this time, the second substrate 5 is disposed at the lower portion and the first substrate 1 is arranged at the upper portion.

When postbaked, the first substrate 1 is bonded with the second substrate 5 by the bonding layer 3'.

That is, the bonding layer 3' is softened by postbaking and fills into the space in which the second substrate electrodes 6 on the second substrate 5 are not formed, and thus the bonding layer closely contacts with the top face of the second substrate 5 constituting the space as well as the side wall of the second substrate electrodes 6, and then, a three-dimensional crosslinked structure is formed by the component (D) in the bonding layer 3', resulting in curing. Consequently, the first substrate 1 is bonded with the second substrate 5.

In the production of the circuit element, an integrated circuit chip, commonly referred to as a circuit chip, is used as the first substrate (first base material) 1. As the second substrate (second base material) 5, a circuit board is used. In that case, the first substrate electrodes 2 are referred to as bumps and the second substrate electrodes 6 are referred to as posts.

As the first substrate 1, for example, insulating substrates such as semiconductor substrate, print substrate, glass substrate and ceramic substrate are used.

The first substrate electrodes 2 are made of ITO (indium tin oxide), electric conductors such as Ti, Ta, Mo, Ni, Al, Cu, Au, Sn and Pb, or alloys thereof.

As the second substrate 5, for example, insulating substrates such as semiconductor substrate, print substrate, glass substrate and ceramic substrate are used.

The second substrate electrodes 6 are made of electric conductors such as Ti, Ta, Mo, Ni and Al, or alloys thereof.

The permanent film made of the chemically amplified positive photosensitive thermosetting resin composition of the present invention is excellent in adhesion to the object to be bonded.

Therefore, connection reliability of functional devices such as electronic parts can be improved. The permanent film has an advantage that a resist coating film has high stability in the exposure step. The reason is assumed to be as follows. That is, since crosslinking due to the component (C) occurs upon prebaking, the strength of the film is secured even when using a liquid epoxy resin as the component (D).

The permanent film is also excellent in properties suited for use as a sealer because of excellent adhesion. The sealer electrically or physically protects a functional device (or location of functional devices). Sealing properties mean performances suited for use as a sealer.

A permanent film having either of, or preferably both of, the excellent bonding properties and sealing properties can be obtained.

The permanent film made of the composition of the present invention is excellent in electrical characteristics (insulating properties), mechanical characteristics (high or low elastic modulus, high or low glass transition temperature), heat characteristics (low thermal expansion, high thermal decomposition temperature), durability (water resistance, chemical resistance, low hygroscopic property and cooling-heating cycle resistance), and more preferably is excellent in heat resistance. The permanent film has a low thermal expansion coefficient and is excellent in resistance to changes in temperature. The permanent film exhibits low water absorption and can suppress leakage current, and also can suppress cracking or peeling on the bonded surface and the resist from occurring as a result of vaporization of water due to heat of solder.

The present invention provides a technique capable of forming a resin layer which is excellent in fluidity upon heat bonding after pattern formation, and also has excellent adhesion as well as bonding properties and/or sealing properties, from a photosensitive thermosetting resin composition to a permanent film.

EXAMPLES

The present invention will now be described in detail by way of examples. In the examples, percentages are by weight unless otherwise specified.

(Preparation of Resin Component)

Various resin components were prepared in the following manner.

(A-1) Resin

Polyhydroxystyrene resin (weight-average molecular weight: 2500) (manufactured by Nippon Soda Co., Ltd., under the product name VP2500)

(A-2) Resin (Pre-Crosslink Type Resin of the First Embodiment)

100 g of a styrene-containing polyhydroxystyrene resin was dissolved in 400 g of methanol and 40 g of pure water. After the mixture was purified with an ion exchange resin and concentrated, the concentration was adjusted to about 30% using γ-butyrolactone. Then, the mixture was concentrated again so as to remove the residual methanol and moisture.

To 333 g of the resin solution, 0.1 g of acetic acid was added and, after stirring at the inner temperature of 100 to 110° C., 9.5 g of CHDVE was added dropwise. After reaction for 20 hours, 4 g of pyridine was added dropwise and the reaction solution was stirred at room temperature for one hour and 300 g of 2-heptanone was dissolved therein.

Then, the solution was washed several times with a methanol/water solution. The 2-heptanone layer was isolated and then concentrated to remove the residual methanol/water.

The resulting polymer has a molecular weight of 85,000. The acid concentration was 0.5 ppm.

(A-3) Resin (Novolak Resin)

Using 1 mol of a mixture of m-cresol/3,4-xylenol in a molar ratio of 90:10, 0.2 mol of salicylaldehyde and 0.6 mol of formaldehyde, a novolak resin was synthesized by a conventional method.

The resulting polymer has a molecular weight of 2,500. Mw/Mn was 4.2 and alkali solubility was 300 nm/second. (Example 1: example corresponding to the second embodiment), (Example 2: example corresponding to second embodiment), (Example 3: example corresponding to first embodiment), (Example 4: using a slightly soluble biphenyl type epoxy resin), (Example 5: using a novolak resin), (Example 6: no addition of a curing accelerator), (Example 7: using a filler), (Comparative Example 1: no addition of the component (D)) and (Comparative Example 2: negative photosensitive composition)

In the respective Examples and Comparative Examples, compositions were prepared by mixing components shown in Table 1. The component (B-1) is a compound represented by the following chemical formula.

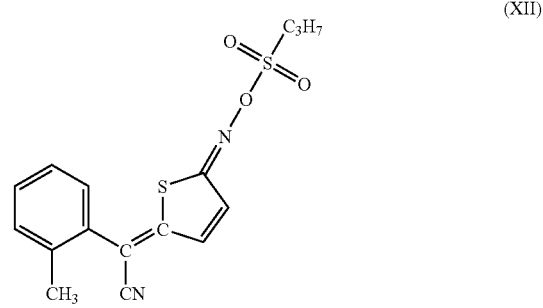

(XII)

Evaluation

Using each of the photosensitive resin compositions obtained in the respective Examples and Comparative Examples, a resist pattern was formed by the following procedure under the following conditions.

1) Application: On a silicon substrate, a photosensitive resin composition was applied in a film thickness 40 μm using a coater manufactured by Tokyo Ohka Kogyo Co., Ltd., under the trade name TR-36000) through a center-dropping spin coating method.

2) Prebake: Prebaking was conducted at 110° C. for 10 minutes.

3) Exposure: Using g, h, and i-rays (aligner), exposure was conducted at 400 mJ to form a hole pattern having a hole diameter of 40 μm.

4) PEB: PEB was conducted at 110° C. for 10 minutes.

5) Alkali development: Development was conducted using a 2.38 wt % solution of TMAH at 23° C. and rinsing was conducted for 30 seconds using pure water. Resolution of via holes having a diameter of 40 μm was evaluated by the following criteria. The case where a hole pattern having a diameter of 40 μm was formed was rated "A", while the case where a hole pattern having a diameter of 40 μm was not formed was rated "B", 6) Postbaking: In an oven, prebaking was conducted at 200° C. for 120 minutes.

In Example 6, prebaking was conducted at 200° C. for 120 minutes.

Then, reliability of the permanent film resist was evaluated.

Fluidity Test Upon Heating after Patterning

After patterning, the resulting sample was cut into pieces 1 cm square, which were placed on a glass plate in a state of facing the resist surface downward, and then held on a hot plate at 200° C. under a load of 1 kgf.

Each sample was removed from the hot plate, cooled and then observed from the side of the glass surface. The case where a via hole pattern was completely filled by flow was rated "A", while the case where a via hole pattern was not filled by flow was rated "B"

Adhesion Test after Heat Curing

After the completion of the fluidity test, each sample was postbaked in an oven at 200° C. for 120 minutes.

After cooling, the sample was observed from the side of the glass surface. The case where neither voids nor cracking occurred was rated "A", while the case where voids and cracking occurred was rated "B".

When the compositions of Examples 1 to 7 were applied to the semiconductor circuit element and the circuit board (flip-chip connection), it was confirmed that a gold bump on the element and a gold pad on the substrate were electrically connected, satisfactorily, and the cured article was satisfactorily bonded between the element and the substrate without causing voids or cracking.

Glass Transition Temperature (° C.)

After the above operations 1) to 6), a glass transition temperature was measured by the method defined in JIS K7140.

After the completion of postbaking, sampling was conducted in the form of a film, and a polytetrafluoroethylene (PTFE) substrate was used as a base material to be coated.

Linear Expansion Coefficient (ppm/k)

After the above operations 1) to 6), a linear expansion coefficient was measured by the method defined in JIS K7140.

After the completion of postbaking, sampling was conducted in the form of a film, and a PTFE substrate was used as a base material to be coated.

Water Absorption (% by Weight)

After the above operations 1) to 6), water absorption was measured by the method defined in JIS K7140.

In the case of high water absorption, leakage current may be caused by electrolytic corrosion. Also vaporization of water due to heat of solder may cause cracking or peeling on the bonded surface and the resist.

The results are shown in Table 1.

TABLE 1

| Components (Parts by weight) | | Examples | | | | | | | Comparative Examples | |
|---|---|---|---|---|---|---|---|---|---|---|
| | | 1 | 2 | 3 | 4 | 5 | 6 | 7 | 1 | 2 |
| Alkali-soluble resin | (A-1) | 100 | 100 | — | 100 | — | 100 | 100 | 100 | — |
| | (A-2) | — | — | 100 | — | — | — | — | — | — |
| | (A-3) | — | — | — | — | 100 | — | — | — | — |
| Photoacid generator | (B-1) | 1 | 1 | 1 | 1 | 1 | 1 | 1 | 1 | — |
| Crosslinking polyvinyl ether compound | (C-1) | 10 | 10 | — | 10 | 10 | 10 | 10 | 10 | — |
| Epoxy resin | (D-1) | 100 | — | 100 | — | 100 | 100 | 100 | — | — |
| | (D-2) | — | 100 | — | — | — | — | — | — | 75 |
| | (D-3) | — | — | — | 75 | — | — | — | — | — |
| Other components | (F-1) | — | — | — | — | — | — | — | — | 100 |
| | (F-2) | — | — | — | — | — | — | — | — | 10 |
| | (F-3) | — | — | — | — | — | — | — | — | 2 |
| | (F-4) | — | — | — | — | — | — | — | — | 10 |
| | (F-5) | 0.3 | 0.3 | 0.3 | 0.3 | 0.3 | — | 0.3 | 0.3 | — |
| | (F-6) | — | — | — | — | — | — | 40 | — | — |
| Solvent | (E-1) | 150 | 150 | 150 | — | 150 | 150 | — | 150 | 150 |
| | (E-2) | — | — | — | 150 | — | — | 150 | 150 | 150 |
| Exposure dose (mJ/cm$^2$) | | 400 | 400 | 400 | 400 | 400 | 400 | 400 | 400 | 400 |
| Resolution of via holes having a diameter of 40 μm | | A | A | A | A | A | A | A | A | A |
| Fluidity upon heating after patterning | | A | A | A | A | A | A | A | A | B |
| Adhesion after heat curing | | A | A | A | A | A | A | A | B | B |
| Glass transition temperature (° C.) | | 150 | 145 | 148 | 158 | 160 | 145 | 150 | 180 | 125 |
| Linear expansion coefficient (ppm/K) | | 70 | 65 | 67 | 65 | 67 | 70 | 62 | 65 | 72 |
| Water absorption (% by weight) | | 1.6 | 1.6 | 1.6 | 1.5 | 1.5 | 1.6 | 1.3 | 6.5 | 1.8 |

Note:
(A-1): Polyhydroxystyrene resin (weight-average molecular weight: 2,500) (manufactured by Nippon Soda Co., Ltd., under the product name VP2500)
(A-2): CHDVE reacted styrene-containing polyhydroxystyrene resin (weight-average molecular weight: 85,000)
(A-3): Novolak resin (weight-average molecular weight: 2,500)
(B-3): Compound represented by the chemical formula (XII)
(C-1): Cyclohexyl divinyl ether
(D-1): Bisphenol F type epoxy resin (weight-average molecular weight: 360) (manufactured by Japan Epoxy Resins Co., Ltd., under the product name Epikote 806)
(D-2): Bisphenol A type epoxy resin (weight-average molecular weight: 370) (manufactured by Japan Epoxy Resins Co., Ltd., under the product name Epikote 828)
(D-3): Slightly soluble biphenyl type epoxy resin (weight-average molecular weight: 370) (manufactured by Japan Epoxy Resins Co., Ltd., under the product name Epikote YX4000)
(E-1): Methyl ethyl ketone
(E-2): Propylene glycol monomethyl ether acetate
(F-1): Reaction product of cresol novolak type epoxy acrylate resin and dibasic acid (weight-average molecular weight: 6,000) (manufactured by Showa Highpolymer Co., Ltd., under the product name Ripoxy SP-4350)
(F-2): Polymerization initiator DETX (manufactured by Nippon Kayaku Co., Ltd.)
(F-3): Polymerization initiator IR-907 (manufactured by Nippon Kayaku Co., Ltd.)
(F-4): Acrylic monomer DPHA (manufactured by Nippon Kayaku Co., Ltd.)
(F-5): Curing accelerator tri-N-decylamine
(F-6): Synthetic spherical silica (average particle size: 0.4 to 0.6 μm) (manufactured by Admatechs Co., Ltd.)

In all examples of the present invention, good results were obtained.

In all examples, the component (D) in the form of liquid was used, although a film having high hardness could be obtained after prebaking, and thus stable exposure could be conducted.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description but is only limited by the scope of the appended claims.

The invention claimed is:

1. A chemically amplified positive photosensitive thermosetting resin composition comprising:
   a reaction product of (A) an alkali soluble resin having a phenolic hydroxyl group and (C) a crosslinking polyvinyl ether compound;
   (B) a compound generating an acid under irradiation with radiation; and
   (D) an epoxy resin.

2. A chemically amplified positive photosensitive thermosetting resin composition comprising (A) an alkali soluble resin, (B) a compound generating an acid under irradiation with radiation, (C) a crosslinking polyvinyl ether compound, and (D) an epoxy resin,
   wherein (B) represented by the following general formulas (V), (VI) or (X):

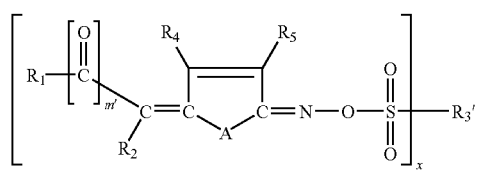

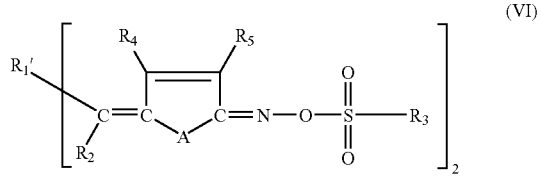

[wherein m' represents 0 or 1; X represents 1 or 2; $R_1$ is a phenyl group which may be substituted with one or more $C_1$-$C_{12}$ alkyl groups, or a heteroaryl group, or, when m' is 0, $R_1$ may further be a $C_2$-$C_6$ alkoxycarbonyl group, a phenoxycarbonyl group or CN; $R_1'$ represents a $C_2$-$C_{12}$ alkylene group; $R_2$ has the same meaning as in $R_1$; $R_3$ represents a $C_1$-$C_{18}$ alkyl group; $R_3'$ has the same meaning as in $R_3$ when X=1, or a $C_2$-$C_{12}$ alkylene group or a phenylene group when X=2; $R_4$ and $R_5$ each independently represents a hydrogen atom, a halogen, or a $C_1$-$C_6$ alkyl group; A represents S, O or $NR_6$; and $R_6$ represents a hydrogen atom or a phenyl group],

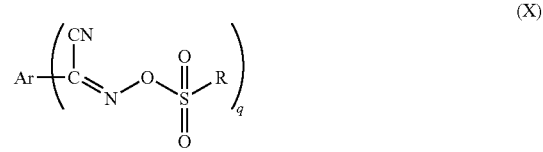

[wherein Ar represents a substituted or unsubstituted phenyl group or a naphthyl group; R represents a $C_1$ to $C_9$ alkyl group; and q represents an integer of 2 or 3].

3. The chemically amplified positive photosensitive thermosetting resin composition according to claim 1, which comprises a curing accelerator for the component (D).

4. The chemically amplified positive photosensitive thermosetting resin composition according to claim 3, wherein the curing accelerator is a basic compound.

5. The chemically amplified positive photosensitive thermosetting resin composition according to claim 2, which comprises a curing accelerator for the component (D).

6. The chemically amplified positive photosensitive thermosetting resin composition according to claim 5, wherein the curing accelerator is a basic compound.

7. A method for formation of a cured article, which comprises applying the chemically amplified positive photosensitive thermosetting resin composition of any one of claims 1 to 6, subjecting to prebaking, subjecting to selective exposure, subjecting to PEB (post-exposure baking) and subjecting to alkali development to form a resist pattern, followed by melting with heating and further heat curing.

8. A cured article obtainable by the method of claim 7.

9. A method for production of a functional device, which comprises forming a resist pattern of and curing the chemically amplified positive photosensitive thermosetting resin composition of any one of claims 1 to 6.

10. A functional device obtainable by the method of claim 9.

11. A method for formation of a cured article, comprising:
    applying a chemically amplified positive photosensitive thermosetting resin composition which comprises (A) an alkali soluble resin, (B) a compound generating an acid under irradiation with radiation, (C) a crosslinking polyvinyl ether compound, and (D) an epoxy resin;
    subjecting the composition to prebaking so as to form an alkali-insolubilized resist layer by a crosslinking reaction of the component (C) with the component (A);
    subjecting the alkali-insolubilized resist layer to selective exposure so as to decompose the crosslinking between the component (C) with the component (A) by an action of an acid generated from the component (B) upon exposure so that the exposed area becomes alkali soluble while the unexposed area remains alkali insoluble:
    subjecting the layer subjected to the selective exposure to post-exposure baking (PEB); and
    subjecting the layer subjected to the PEB to alkali development to form a resist pattern, followed by melting with heating and further heat curing by the crosslinking reaction of the component (D) with the component (A).

* * * * *